United States Patent [19]

Matsumoto et al.

[11] Patent Number: 5,668,965
[45] Date of Patent: Sep. 16, 1997

[54] MENU SYSTEM FOR DATA PROCESSOR

[75] Inventors: Noriko Matsumoto, Kyoto; Toshiro Furusawa; Tamotsu Nishiyama, both of Osaka, all of Japan

[73] Assignee: Matsushita Electric Industrial Co., Ltd., Osaka, Japan

[21] Appl. No.: 616,763

[22] Filed: Mar. 15, 1996

Related U.S. Application Data

[63] Continuation of Ser. No. 119,597, Sep. 13, 1993, abandoned.

[30] Foreign Application Priority Data

Sep. 14, 1992 [JP] Japan .................................. 4-244379
Sep. 6, 1993 [JP] Japan .................................. 5-220373

[51] Int. Cl.⁶ .......................................................... G06F 3/14
[52] U.S. Cl. ............................................. 345/352; 345/333
[58] Field of Search ......................... 395/326, 332, 395/333, 352, 353, 354, 355

[56] References Cited

U.S. PATENT DOCUMENTS

| | | |
|---|---|---|
| 4,821,211 | 4/1989 | Torres ..................................... 395/156 |
| 5,062,060 | 10/1991 | Kolnick ................................... 395/159 |
| 5,065,347 | 11/1991 | Pajak et al. ............................ 395/159 |
| 5,305,435 | 4/1994 | Bronson ................................. 395/159 |
| 5,327,529 | 7/1994 | Fults et al. ............................. 395/155 |
| 5,371,851 | 12/1994 | Pieper et al. .......................... 395/164 |

*Primary Examiner*—Thomas G. Black
*Assistant Examiner*—Ruay Lian Ho
*Attorney, Agent, or Firm*—McDermott, Will & Emery

[57] ABSTRACT

In a data processor such as a CAD system for LSI design, a hierarchical structure of a plurality of objects each having a circuit data is represented in a relation between a window on a menu screen and a plurality of figure blocks on the window. One of the plural figure blocks on the window is represented in a different window so as to represent a multi-hierarchical structure of the objects, and a block figure group is arranged on the different window. A user selects, using a mouse, an object to be processed on a menu screen representing a floor plan.

14 Claims, 21 Drawing Sheets

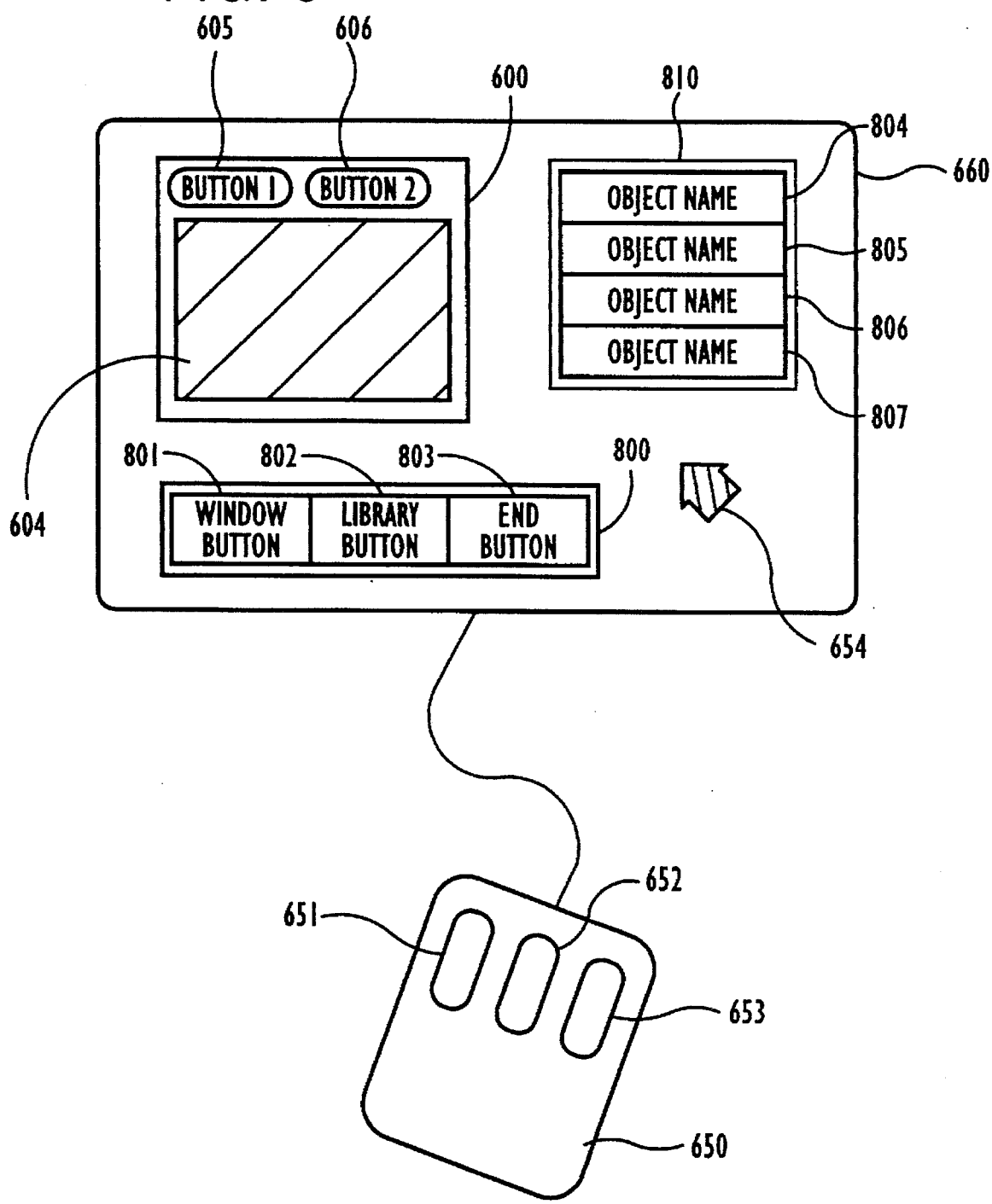

MENU SYSTEM FOR DATA PROCESSOR

This is a continuation application of application Ser. No. 08/119,597 filed Sep. 13, 1993 and now abandoned.

BACKGROUND OF THE INVENTION

This invention relates to a menu system used to select one object as an object to be processed from a plurality of objects having a hierarchical structure on a screen of a data processor such as a CAD system for circuit design.

Conventionally, an object-oriented data processor has been developed. A hierarchical menu system is disclosed in patent Application Laying Open Gazette No. 58-195942, in which a menu screen of a lower level is selectable from a menu screen of an upper level, corresponding to a hierarchical structure of objects. Another menu system is proposed in Japanese Patent Application Laying Open Gazette No. 2-240771, in which the hierarchical structure is represented by combining like a tree with lines symbols of objects.

Design for LSI requires a series of procedures from a function design to a layout design. Conventionally, CAD tools are being developed for converting a circuit data (function data) of function level represented per each element by function description language to a circuit data (logic data) of logic level and for converting the logic data to a circuit data (layout data) of mask layout level. For the individual CAD tools, the hierarchical menu systems and the tree-like hierarchical representation suffice, because an individual CAD tool requires only that a plurality of objects of circuit data of the same level is provided, from which it can select and process objects.

A CAD system, called frame work, is developed as a total system of CAD tools for LSI design. In the CAD system of this type, objects having circuit data of various levels such as function data, logic data, or layout data are registered in a library to enable reuse of the design source. The objects have a hierarchical structure corresponding to the hierarchical structure of the circuit elements. When the above-mentioned hierarchical menu system is applied to such a CAD system with objects having such complicated structures, a complex procedure is required for selecting an object to be processed owing to the limited information available from one screen, thus lowering the operationality. When the tree-like hierarchical representation is applied thereto, a problem remains that a user has difficulty understanding the shape, scale, processing state (to what level a data is converted), and location of the elements. These problems exist not only in CAD systems but also in menu systems regarding many objects having complicated structures.

SUMMARY OF THE INVENTION

The present invention has the object of improving the operationality of a menu system for a data processor.

To attain the above object, in a menu system according to the present invention, a hierarchical structure of objects is represented in a relation between a window on a screen and a figure block on the window. To represent a multi-hierarchical structure of the objects, one of the figure blocks on the window is represented in a different window and a figure block group is arranged on the different window.

When the present invention is used in, for example, a circuit design, a circuit image having various information such as shape and scale of individual elements on a floor plan can be introduced into a menu system for user operation. As a result, the amount of information which can be displayed at one time is increased, making the menu system more user friendly thus enhancing the operationality of the menu. Menu creation and circuit design can be conducted concurrently. Also, since the disclosed herein can be used not only in a top-down design but also in a bottom-up design, design source can be effectively reused.

BRIEF DESCRIPTION OF THE DRAWINGS

FIG. 3 is an explanatory drawing showing an example of an initial menu screen of a display part in the CAD system in FIG. 1.

FIG. 18 is employed.

DETAILED DESCRIPTION OF PREFERRED EMBODIMENT

Figure 1:
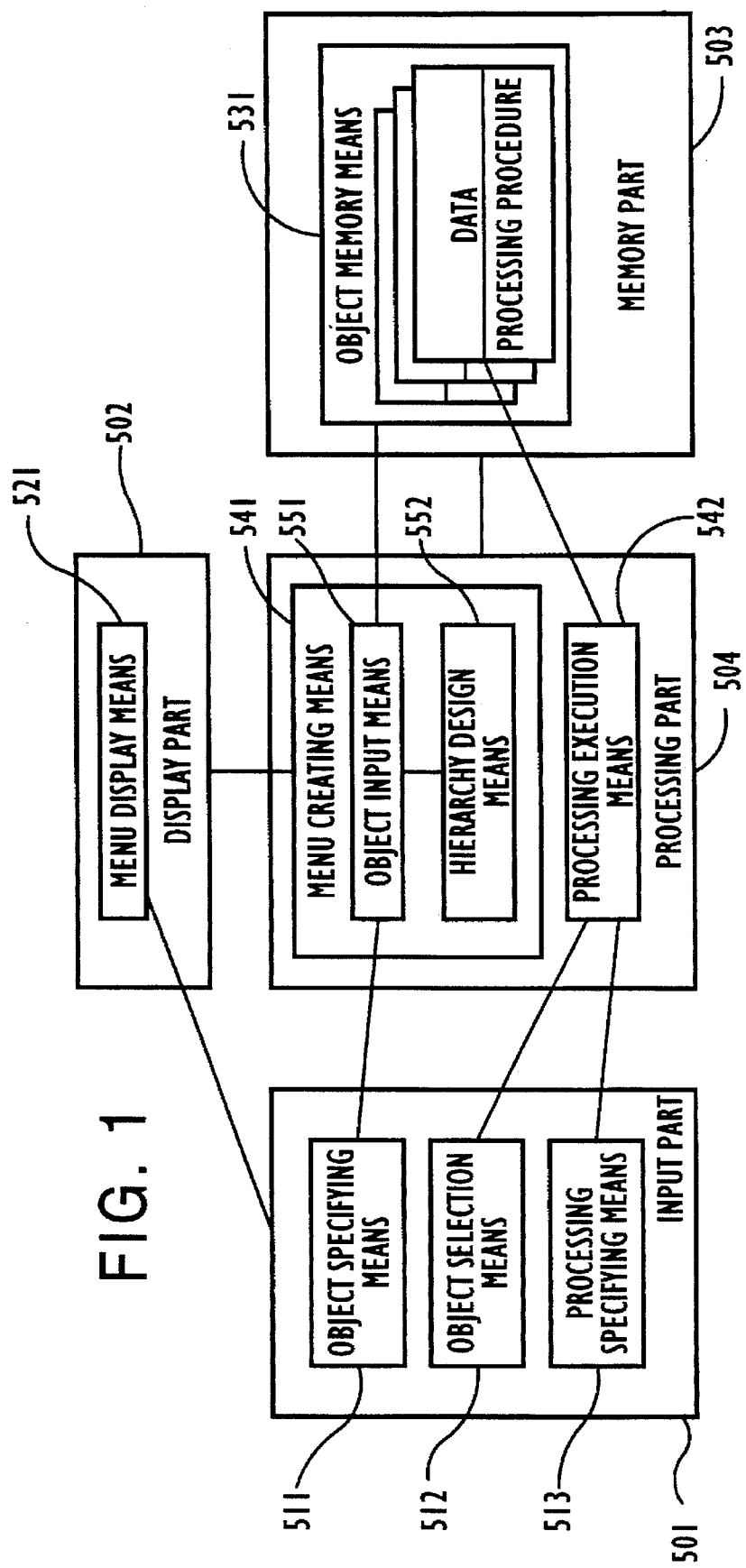
FIG. 1 is a block diagram showing a construction of a CAD system according to an embodiment of the present invention.

FIG. 1 is a block diagram showing a construction of a CAD system for LSI design of type called frame work according to an embodiment of the present invention. The system in FIG. 1 is provided with an input part 501 having a pointing device such as a keyboard or a mouse, a display part 502 having a CRT, a memory part 503 having a disk device, and a processing part 504 having a processor, so that a circuit design is executed, sequentially selecting an object to be processed from a plurality of objects, with a menu on a screen.

The input part 501 comprises object specifying means 511, object selection means 512 and processing specifying means 513. The display part 502 comprises menu display means 521. The memory part 503 comprises object memory means 531. The processing part 504 comprises menu creation means 541 and processing execution means 542.

The present invention provides a graphical menu system to represent elements arranged in a hierarchical structure, such as circuit blocks having different level of abstraction, used while designing an electrical circuit. These elements are represented by "objects," with each object having information on one element including figure data for displaying the element in the menu of the present invention. The object memory means 531 memorizes many objects. In the CAD system, a is stored in the object memory means 531. This library has many objects for managing batch circuit data of various levels, such as function data, logic data and layout data as elements together with the processing procedure (design procedure for selecting an optimum CAD tool). The library has a hierarchical structure corresponding to that of the circuit elements. Each object has figure data for displaying the element in a menu.

The object specifying means 511 specifies a plurality of objects from the object memory means 531, necessary to construct a circuit to be designed. The menu creation means 541 includes object input means 551 for inputting the plurality of objects specified by the object specifying means 511 and hierarchy design means 552 for designing a hierarchical structure of a menu corresponding to the hierarchical structure of the objects in the object memory means 531. The menu display means 521 displays a first window on a screen to represent the circuit to be designed, and displaying a first figure block group on the first window, cooperating with the menu creation means 541, so as to represent the plural objects specified by the object specifying means 511. Each of the plurality of objects specified by the object specifying means 511 belongs to a lower hierarchical level than the object represented by the first window.

In response to user input, the object selection means 512 selects an object to be processed from the first figure block group in the first window, which is displayed on the screen of the menu display means 521. The processing specifying means 513 specifies a step of a design processing to be applied to the object selected by the object selecting means 512. The processing execution means 542 executes the step of the design processing specified by the processing specifying means 513.

Figure 2A:
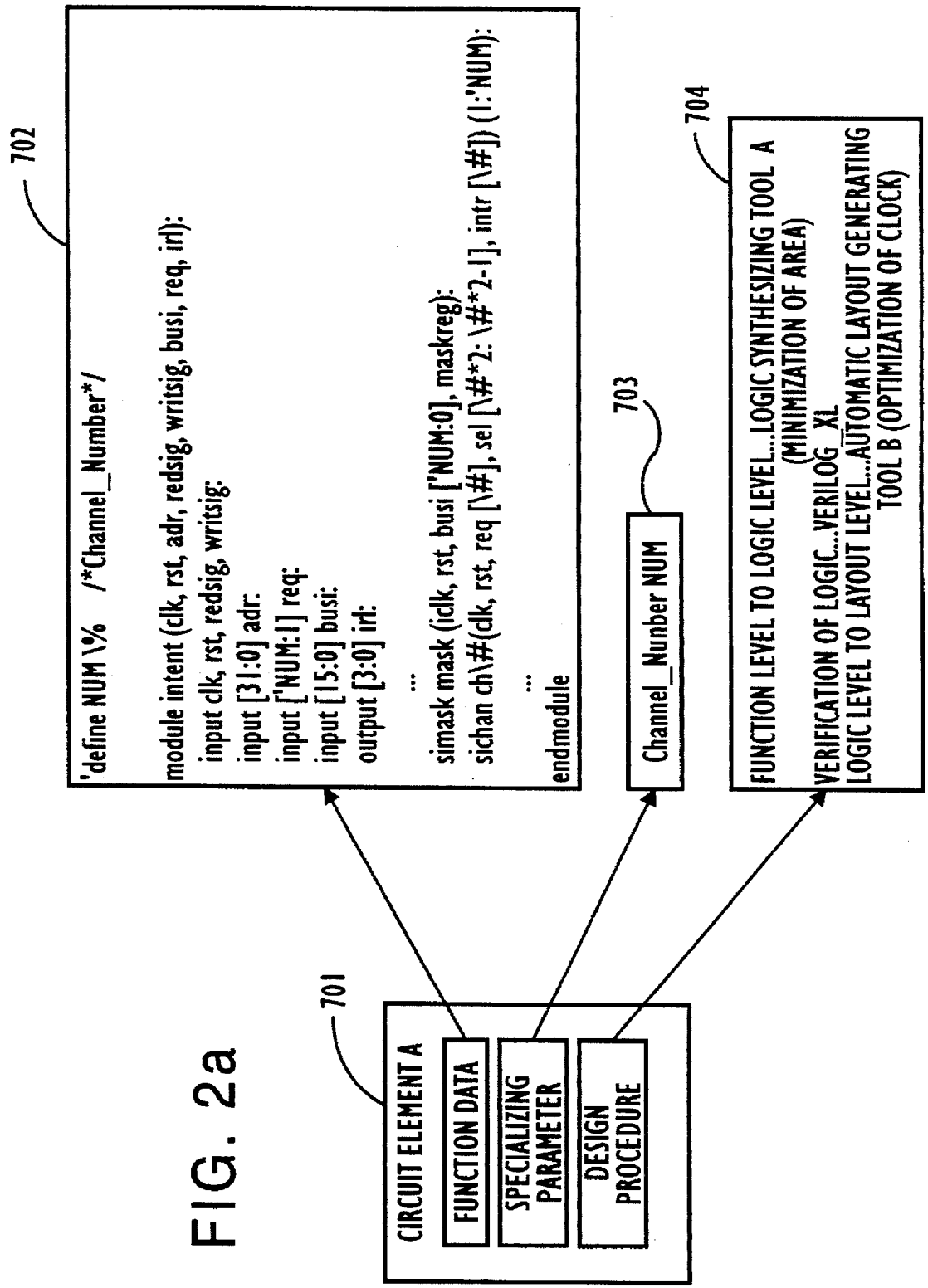
FIG. 2a is an explanatory drawing showing a concrete example of a registration element in a memory part of the CAD system in FIG. 1.

A concrete example of the LSI design by the CAD system in FIG. 1 is discussed next, referring to FIGS. 2a, 2b, and 2c. In FIG. 2a, a circuit element A (701) is one of elements registered in the object memory means 531. Circuit element A has a parameterized function description, indicated by 702 as circuit data, information regarding a parameter necessary to be set for defining a function, indicated by 703 as conversion information, and information regarding a design procedure, indicated by 704. Circuit element A is specified by the object specifying means 511 to generate a design object.

Figure 2B:
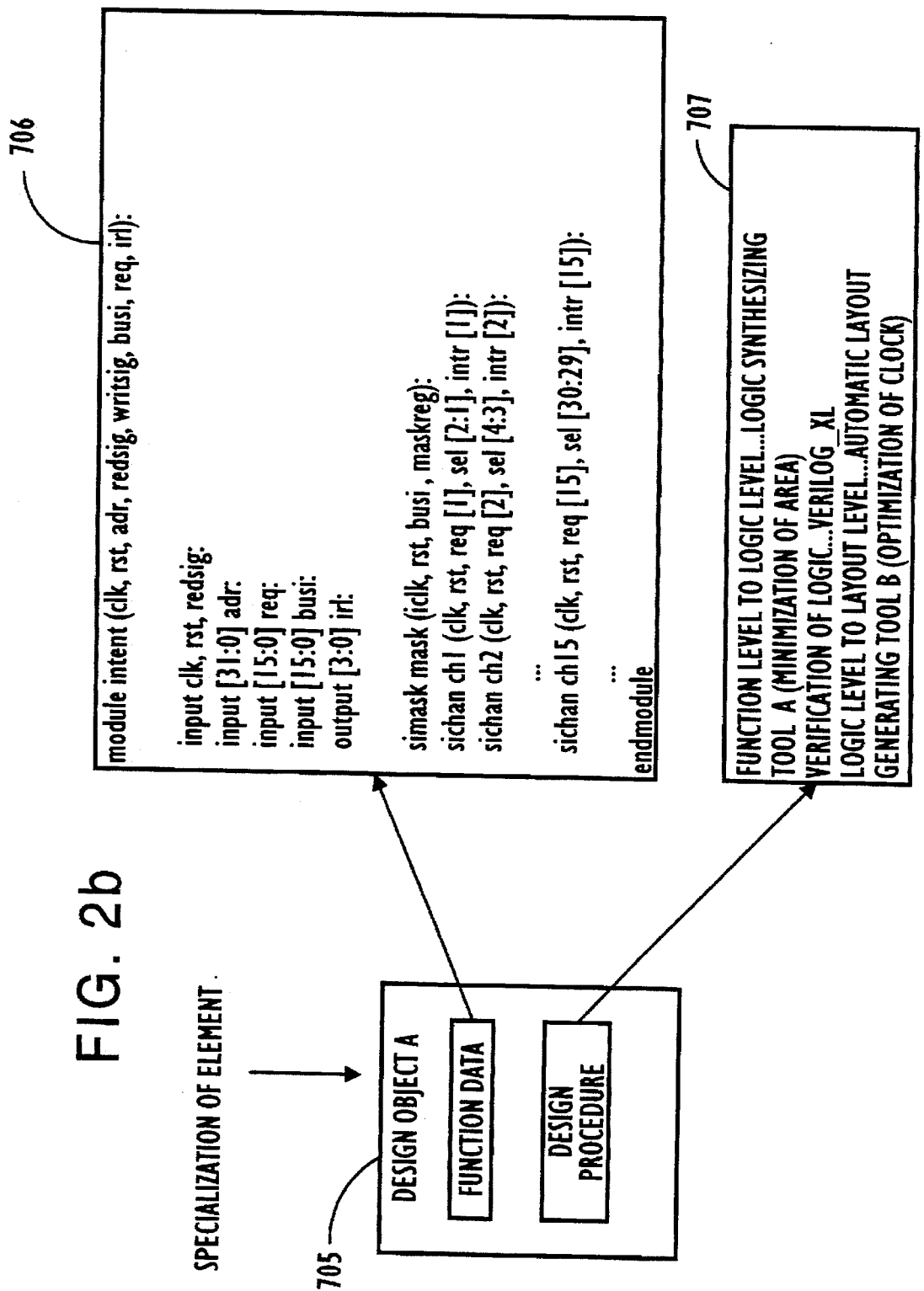
FIG. 2b is an explanatory drawing showing a concrete example of a final design object generated in the CAD system in FIG. 1>
Figure 2C:
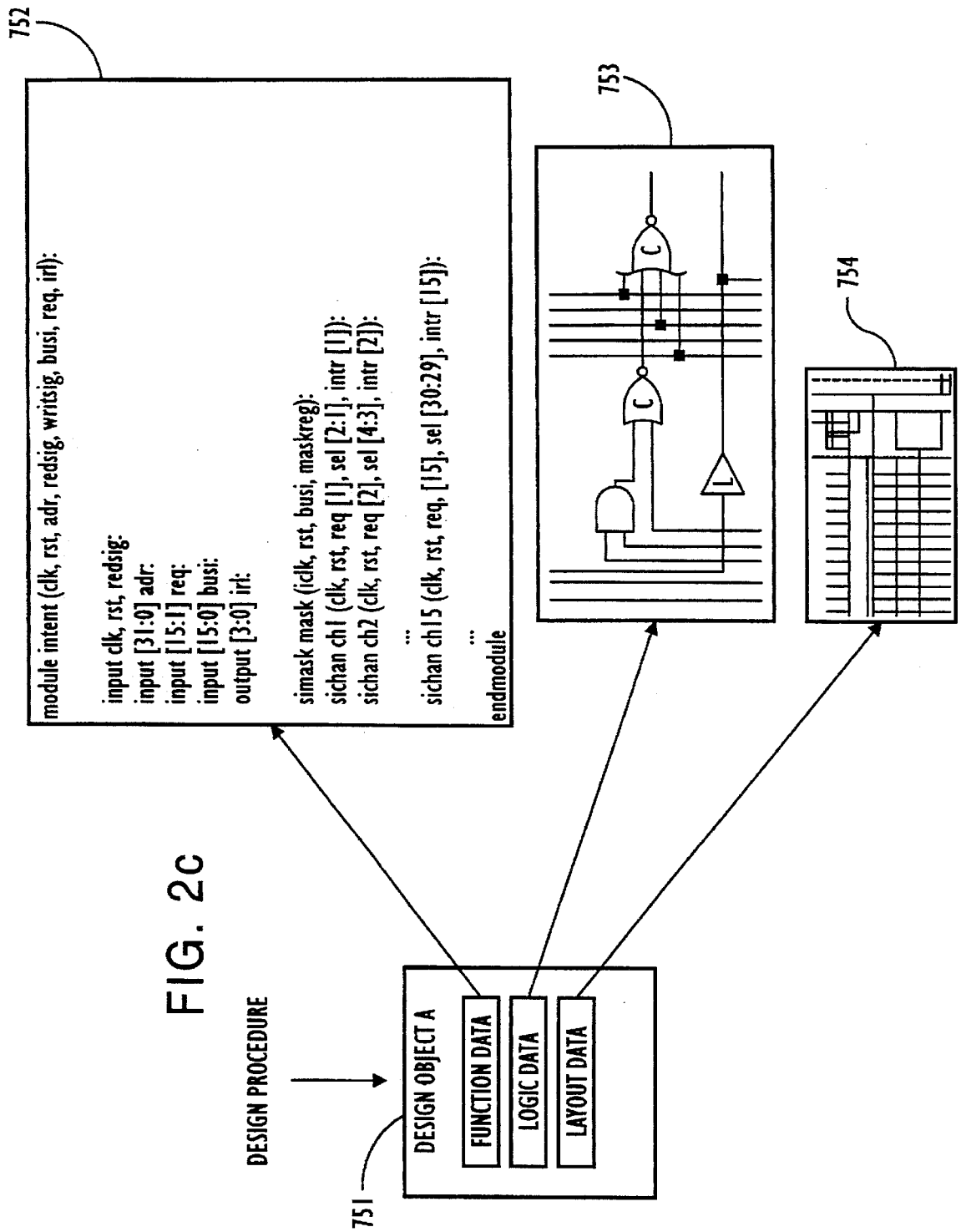
FIG. 2c is an explanatory drawing showing a concrete example of a final design object converted in the CAD system in FIG. 1.

By providing a parameter to the parameter information 703, a design object A (705) is generated, as shown in FIG. 2b. The design object A includes a function description 706, generated by operating the parameter provided to the function description 702 as the circuit data of a function level, and a design procedure 707 for converting the data. In the example shown in FIG. 2b, a value 15 is assigned to parameter variable NUM to set bit width and repetition times. The circuit design is conducted by arranging the design objects, creating the floor plan.

Next, a conversion processing to obtain actual circuit data is executed by selecting the design object A by the object selection means 512, and specifying a conversion instruction to a specific target level of the processing to the design object A by the processing specifying means 513. FIG. 2c illustrates a conversion result of the design object A 751 when an instruction for converting to layout data is provided to the design object A. The processing is executed in accordance with the design procedure 707 on function description 706. First, a logic synthesis tool A is operated on the function description 706 in such a way that the area is minimized, generating logic map 753. Then, an automatic layout generation tool B is operated to the logic map data 753 in such a way that the wiring of a clock line is optimized, generating layout data 754.

FIG. 3 shows an example of an initial menu screen of the display part 502 in the CAD system taught by the present invention. In FIG. 3, a mouse 650 is provided as the input part 501, 660 is a menu screen of the display part 502. The mouse 650 has left, center and right mouse buttons 651, 652, 653, A console menu 800, a library data selection 810, a mouse cursor 654 and a window 600 representing one object are displayed on the menu screen 660.

The console menu 800 includes a window button 801 for displaying the window 600, a library button 802 for displaying the library data selection menu 810, and an end button 803 for terminating the operation of the CAD system. In the CAD system, an instruction to the processing part 504 is specified by moving the mouse cursor 654 on the menu screen 660 onto the console menu 800, the library data selection menu 810 or the window 600 and clicking any of the three mouse buttons 651–653. Library data selection menu 810 displays a list of names of the objects stored in the memory part 503, such as object names 804–807. The window 600 includes a sheet 604 indicating the location of figure blocks, a first button 605, and a second button 606.

In the embodiment shown in FIG. 3, an object registered in the memory part 503 corresponding to an object name displayed in the library data selection menu 810 is fetched by selecting any of the object names 804–807 displayed by operating the mouse 650. When an object name is selected from the library data selection menu 810, the shape of the mouse cursor 654 is changed to indicate an input state for arranging the figure block representing the object onto the sheet 604 of the window 600. The object is then displayed as a figure block at a desired position on the sheet 604 by moving the mouse cursor 654 onto the sheet 604 and clicking left button 651.

Figure 4:
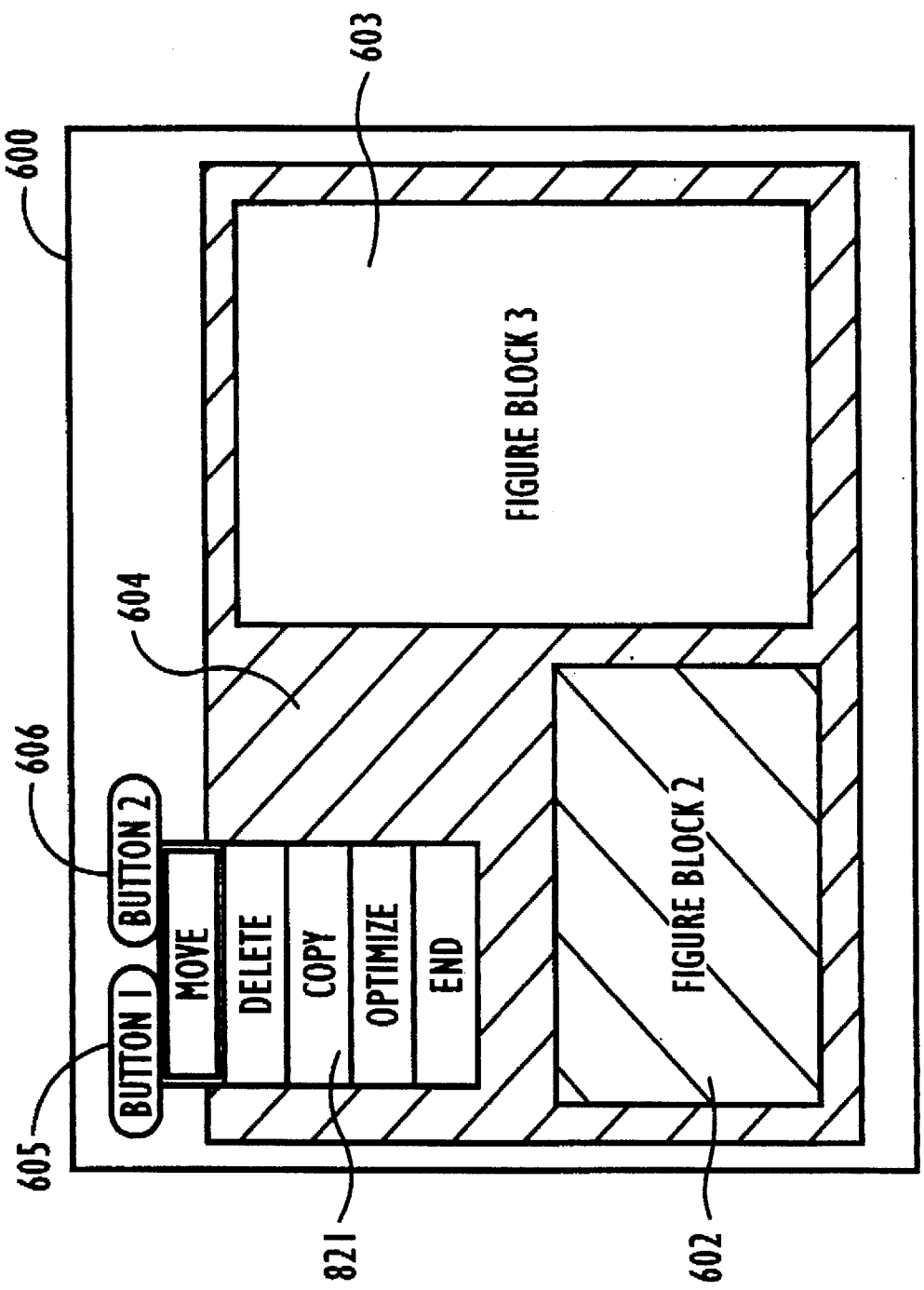
FIG. 4 is a view for explaining a function of a first button on a window in FIG. 3.

FIG. 4 shows a state where two figure blocks 602, 603 are arranged on the sheet 604. For example, when the mouse cursor 654 is moved onto the figure block 602 and the left button 651 is clicked, a display color of the figure block 602 is changed and the object corresponding to figure block 602 is selected. Under the state where the object is selected in this way, when the mouse cursor 654 is moved to button 605 on the window 600 and the left button 651 is clicked, pull-down menu 821 appears for selecting a process to be applied to the object such as move, delete copy. The process "Move" can be selected to change the location of a figure block, such as figure block 602, on the sheet 604. "End" in the pull-down menu 821 is to be selected when the window 600 is closed.

Figure 5:
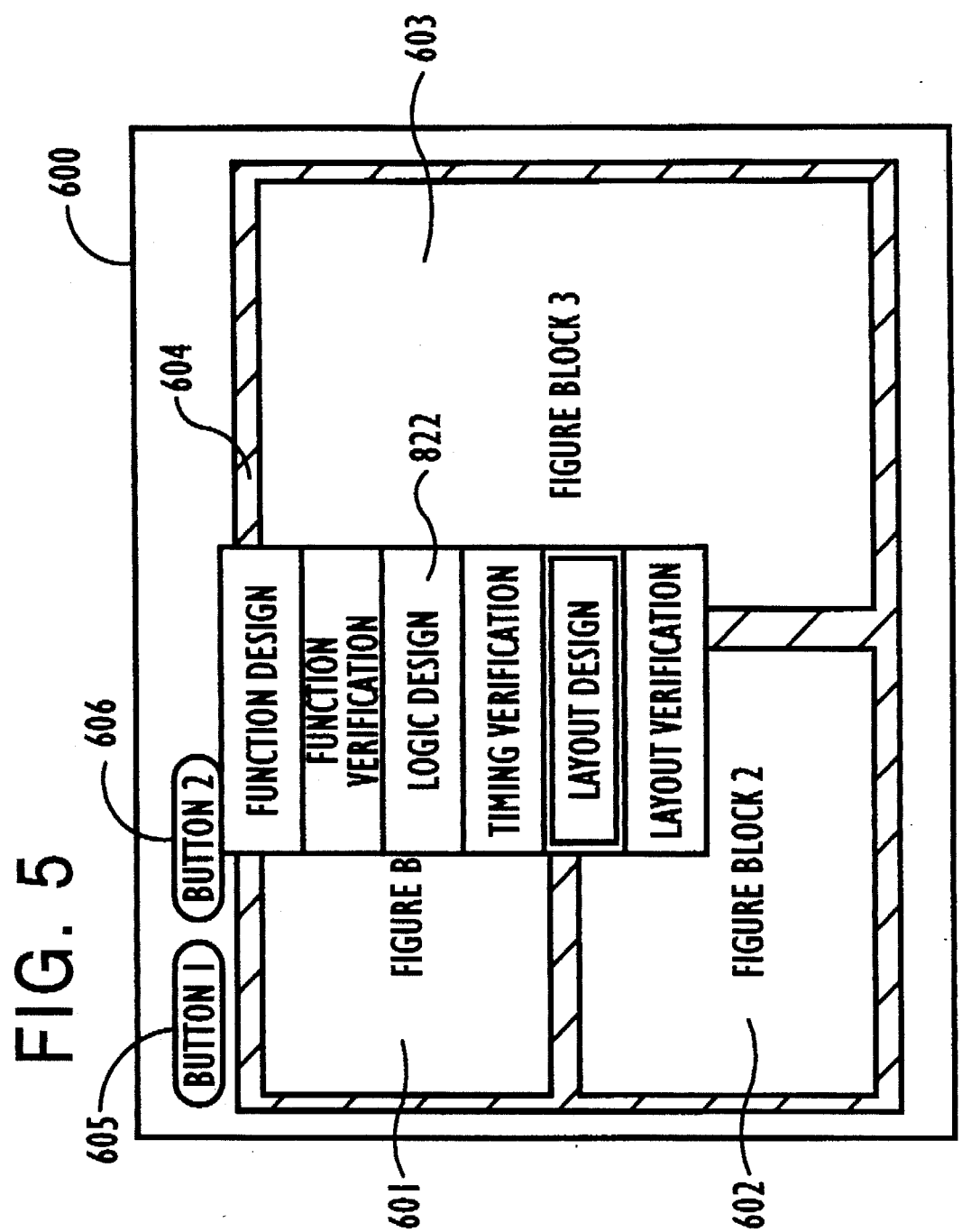
FIG. 5 is a view for explaining a function of a second button on the window in FIG. 3.

FIG. 5 shows three figure blocks 601, 602, 603 are arranged on sheet 604. If the second button 606 on the window 600 is selected by the mouse 650 under the state where the object corresponding to the figure block 602 is selected, a pull-down menu 822 for selecting a process such as function design, logic is design or layout design appears. When "layout design" is selected, circuit data of the object corresponding to the selected figure block, in this case figure block 602, is converted into the layout data.

Figure 6:
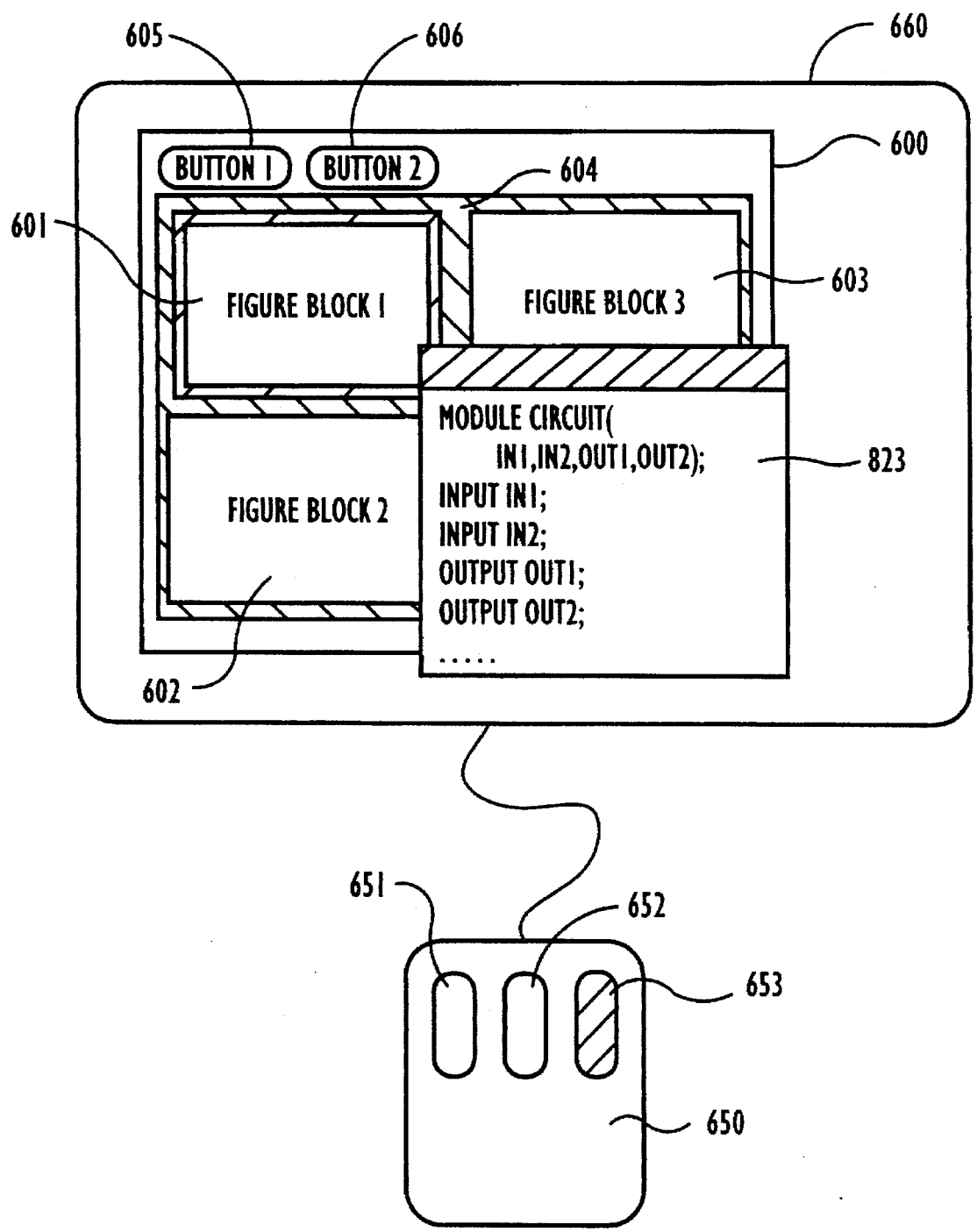
FIG. 6 is an explanatory drawing showing an example of a screen displaying a function data (circuit data represented by function description language) in the CAD system in FIG. 1.
Figure 7:
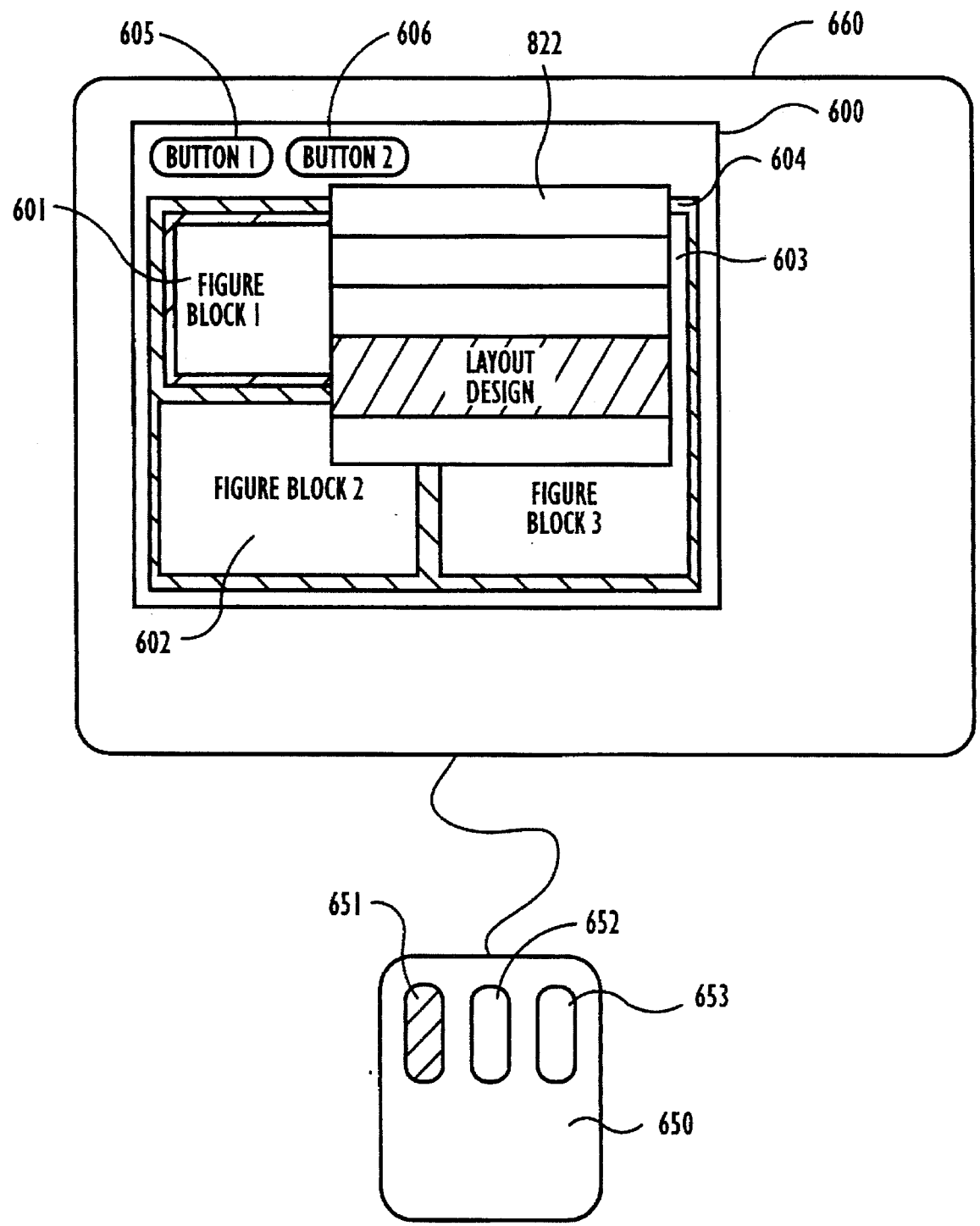
FIG. 7 is an explanatory drawing showing a state instructing to convert the function data in FIG. 6 to a layout data.
Figure 8:
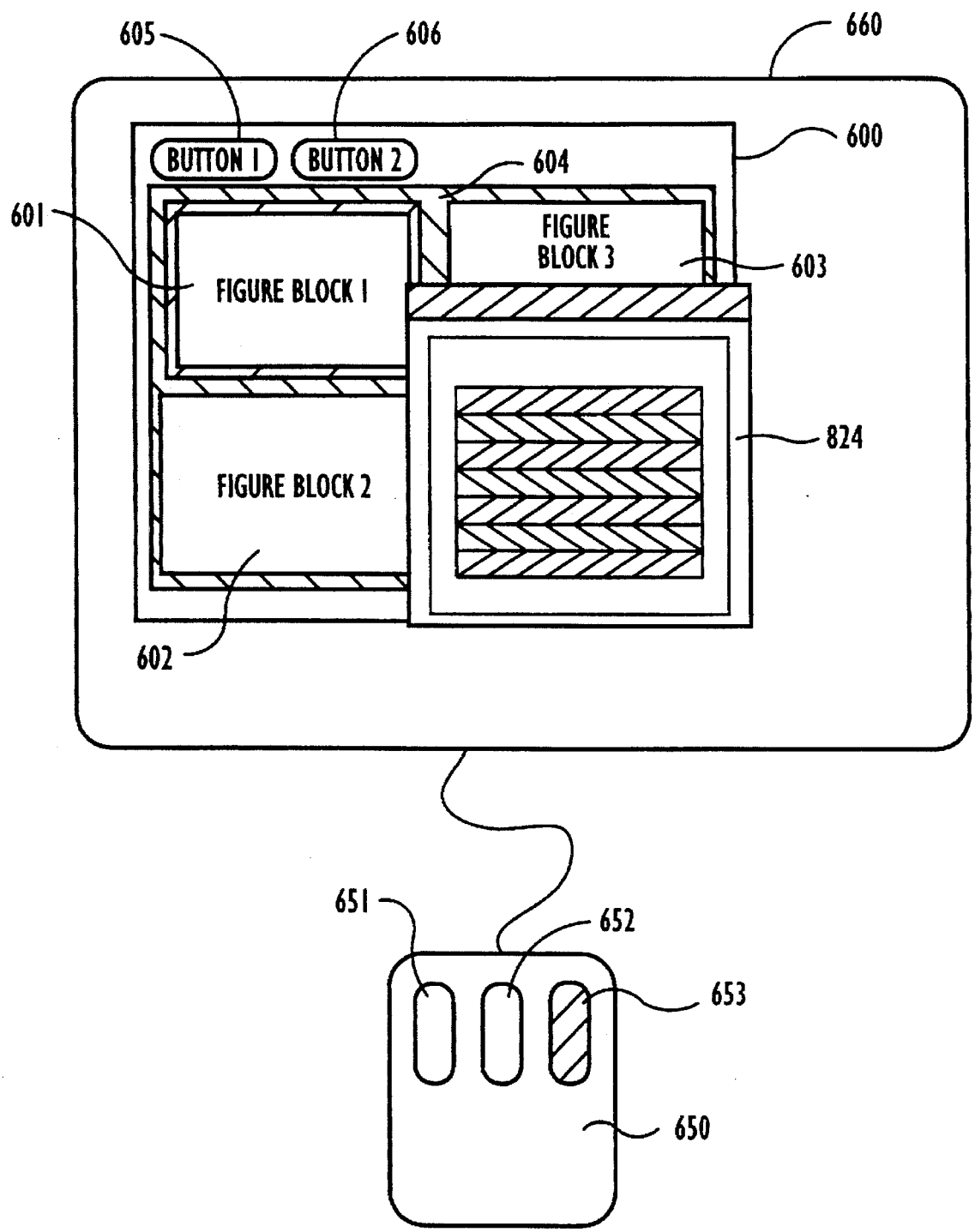
FIG. 8 is an explanatory drawing showing an example of a screen displaying the layout data after conversion in the CAD system in FIG. 1.

As shown in FIG. 6, when the right mouse button 653 is clicked upon selection of, for example, the figure block 601, the circuit data of the object corresponding to selected figure block 601 is displayed on the menu screen 660. In the example in FIG. 6, the function data 823 regarding the figure block 601 is displayed. FIG. 7 shows a state of selecting an instruction to convert the function data 823 shown in figure block 601 of FIG. 6 into layout data. The above-mentioned pull-down menu 822 is displayed by selecting the second button 606 on the window 600, then selecting "layout design" by operating the left mouse button 651. FIG. 8 shows a state where the layout data 824 after conversion is displayed by the same operation as in FIG. 6.

Figure 9:
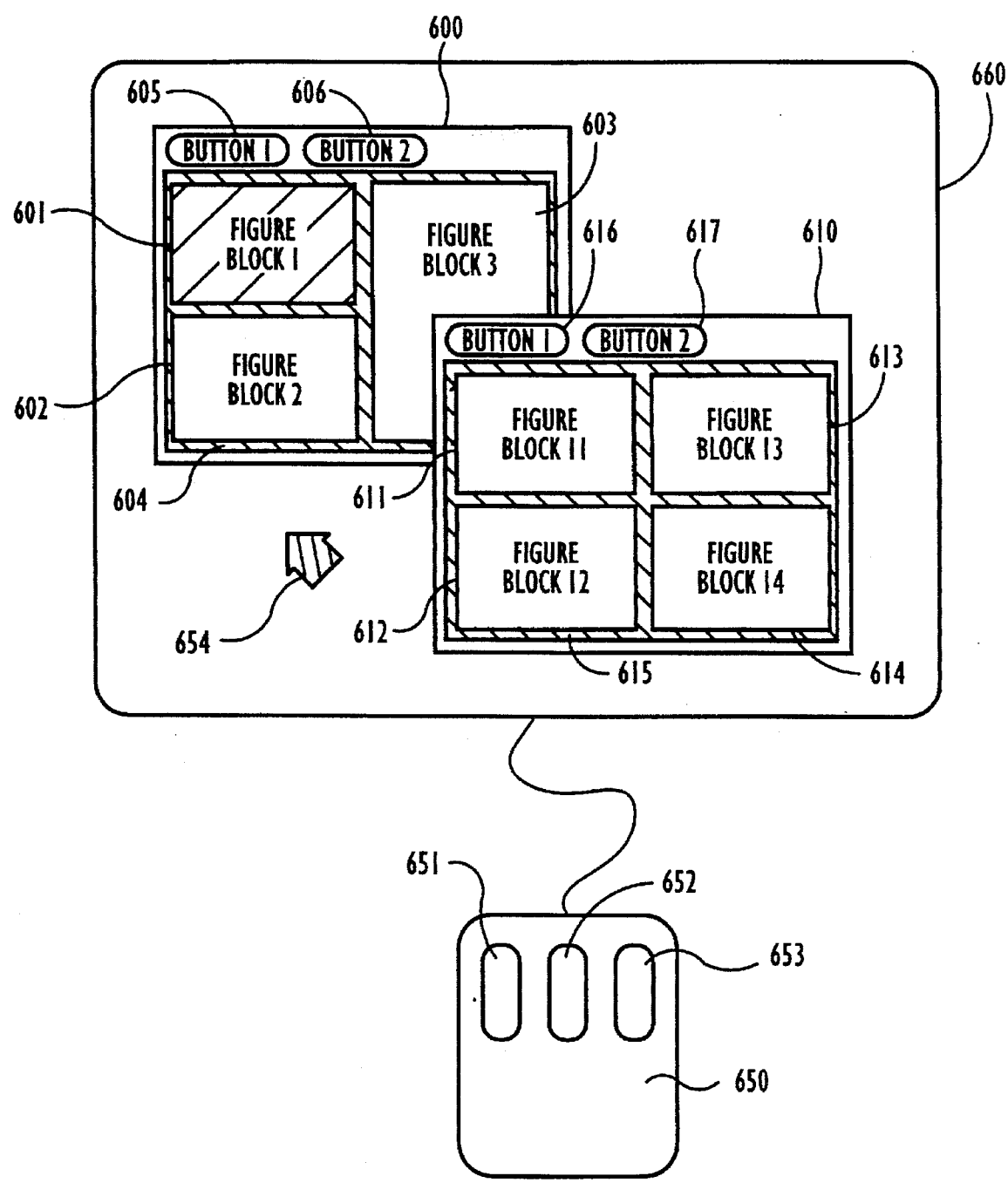
FIG. 9 is an explanatory drawing showing an example of a menu screen representing a multi-hierarchical structure of objects in the CAD system in FIG. 1.

FIG. 9 shows an example of the menu screen 660, representing a multi-hierarchical structure of objects by the first window 600, the three figure blocks 601, 602, 603 on the first window 600, a second window 610, and four figure blocks 611, 612, 613, 614 on the second window 610.

The second window 610 represents an object represented by one of the figure blocks on the first window 600, and like the first window 600, includes a sheet 615 indicating the location of the figure blocks, a first button 616, and a second button 617. First and second buttons 616, 617 on the second window 610 have the same function of those of the first window 600 respectively. A figure block is transmittable between the first window 600 and the second window 610.

In the CAD system provided by the present invention, an object is displayed as a window and/or a figure block. As previously discussed, the object corresponding to the first window 600 is an object having a higher hierarchical level than the objects corresponding to the three figure blocks 601-603. In other words, the configuration of first window 600 and the three figure blocks 601-603 thereon indicate that the object corresponding to window 600 is composed of the three objects, corresponding to figure blocks 601-603.

Figure 10:
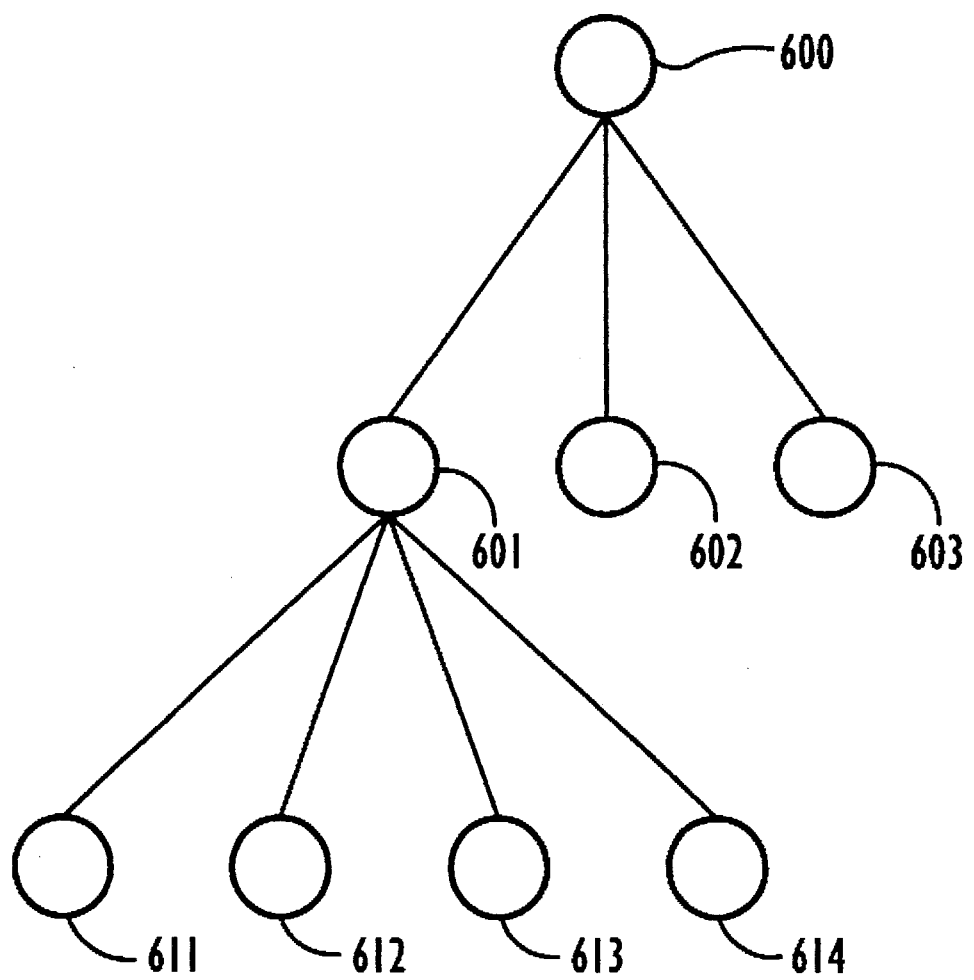
FIG. 10 is a schematic view showing the multi-hierarchical structure of the objects represented in the menu screen in FIG. 9.

By moving the mouse pointer 654 onto figure block 601 and double-clicking the left button 561 of the mouse 650, the second window 610 is opened, displaying the object corresponding to figure block 601 in greater detail. The object corresponding to the second window 610 is an object of higher hierarchical level than the object corresponding to the four figure blocks 611-614. In other words, the configuration of second window 610 and the four figure blocks 611-614 thereon indicate that the object corresponding to window 610 is composed of the four objects corresponding to figure blocks 611-614. FIG. 10 shows a hierarchical structure of the eight objects represented by the two windows 600, 610 and seven figure blocks 601-603, 611-614. A method of arranging the figure blocks 611-614 onto the second window 610 is the same as the method of arranging the figure blocks 601-603 onto the first window 600. In the embodiment illustrated in FIG. 9, the sheet 615 on the second window 610 has the same shape as the figure block 601 on the first window 600, and is displayed proportionally. For example, when the construction of the figure blocks 611-614 on the second window 610 is changed, the shape of the figure block 601 corresponding to the second window 610 is changed accordingly. In other words, the location of the figure blocks 601-603 and 611-614 on the respective windows 600, 610 represent a floor plan of the circuit design.

FIGS. 11-14 are flow charts showing the operation of the CAD system taught by the present invention.

Figure 11:
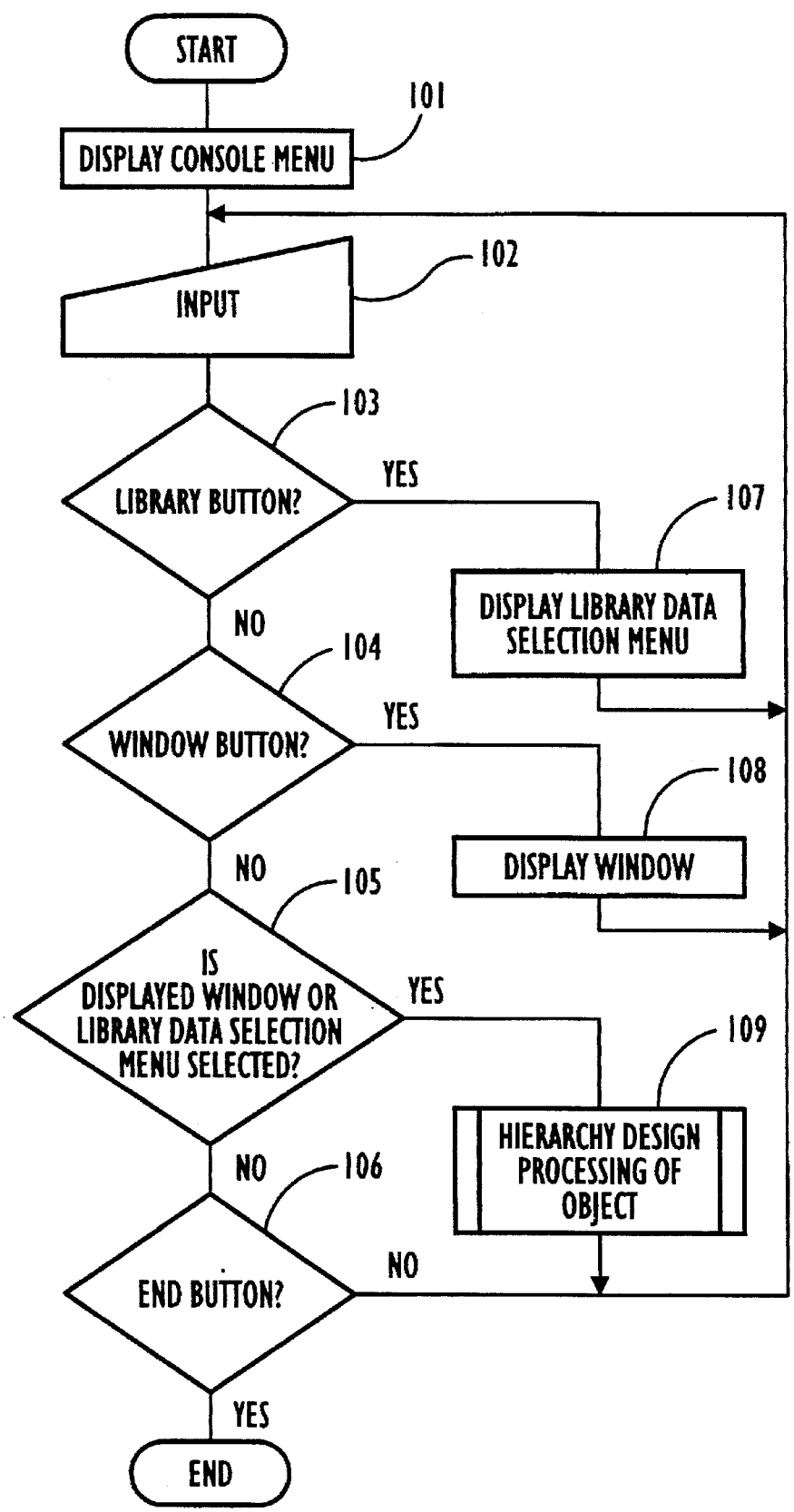
FIG. 11 is a flow chart showing an operation of the CAD system in FIG. 1.
Figure 12:
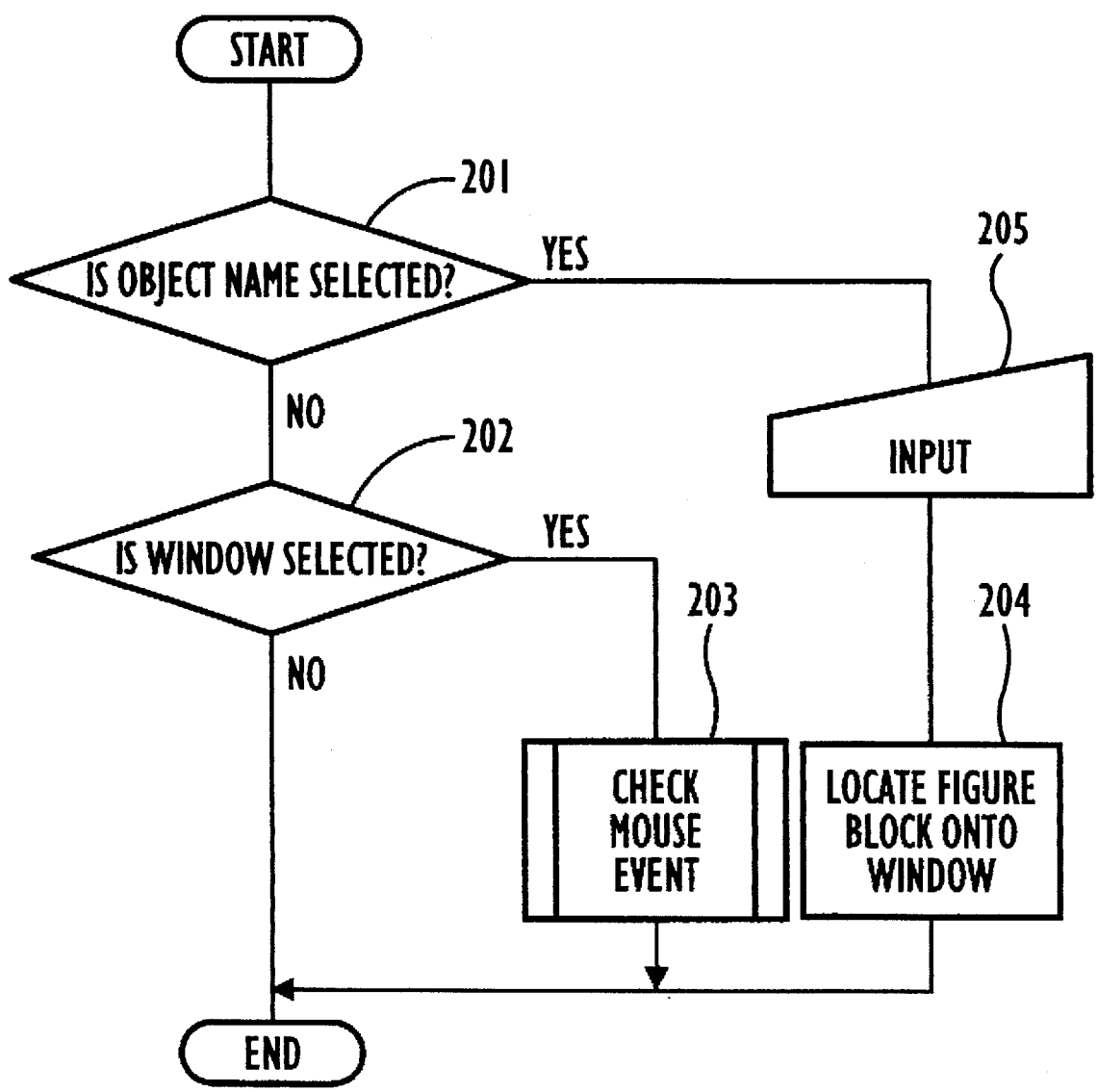
FIG. 12 is a flow chart showing a detailed procedure of a hierarchy design processing of the objects in FIG. 11.

When the CAD system is powered, the console menu 800 (refer to FIG. 3) is displayed in a step 101 in FIG. 11. At a step 102, any of the window button 801, the library button 802 or the end button 803 on the console menu 800 is selected by the operation of the mouse 650. When the library button 802 is selected, the routine proceeds from a step 103 to a step 107 to display the library data selection menu 810. When the window button 801 is selected, the routine proceeds from a step 104 to a step 108 to display the window 600. If the window 600 or the library data selection menu 810 is already displayed and is selected, the routine proceeds from a step 105 to a step 109 to execute a in the hierarchical design of the objects. FIG. 12 shows a detailed procedure of the hierarchy design processing of the objects in the step 109. When the end button 803 is selected and is confirmed at step 106, the operation of the CAD system is terminated.

Discussed next is an operation procedure for selecting an object, using the library data selection menu 810, and for arranging the selected object onto the window 600 as a figure block, with reference to FIG. 12.

As shown in FIG. 3, the console menu 800, the window 600 and the library data selection menu 810 are already displayed. When the one of object names in the library data selection menu 810 is selected, the object whose name is selected is fetched from the memory part 503, then the routine proceeds form a step 201 to a step 205 to wait for the operation of mouse 650. When the mouse cursor 654 is moved to a desired position on the sheet 604 of the window 600 and the left button 651 is clicked, a figure block representing the objects is arranged at the desired position on the sheet 604 at a step 204. The scale, shape and label of the figure block are determined according to the figure data of the corresponding object. The object selected using the library data selection menu 810 and the corresponding figure block displayed, is registered into the object represented by the window 600 as a lower-rank object.

The figure blocks 601-603 are sequentially arranged onto the window 600 by repeating the above operation.

Figure 13:
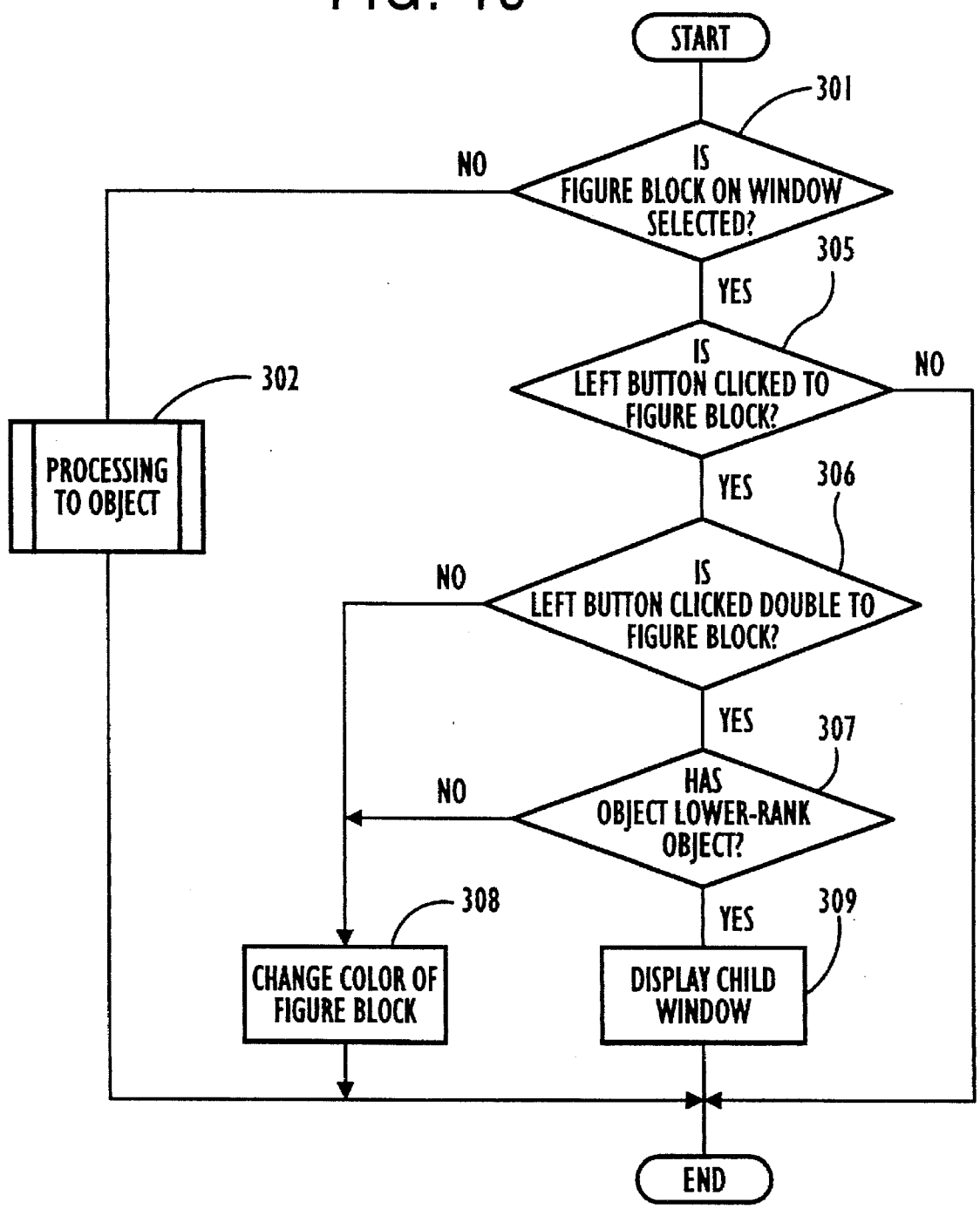
FIG. 13 is a flow chart showing a detailed procedure of a check processing of a mouse event in FIG. 12.

When the selection operation is conducted to the window 600, the routine proceeds from a step 202 to a step 203 to check a mouse event. FIG. 13 shows a detailed procedure of the check processing in the step 203.

As shown in FIG. 13, when one figure block 601 on the window 600 is selected, the routine proceeds from a step 301 to a step 305 to check whether the left button 651 of the mouse is clicked. When the left button 651 is clicked just one time, the routine proceeds from a step 306 to a step 308 to change the display color of the selected figure block 601 for the purpose of drawing the user's attention. When the left button 651 is clicked twice, the routine proceeds from the step 306 to a step 307 to check whether the object corresponding to the figure block 601 has a lower-rank object. When it has the lower-rank object, the routine proceeds from the step 307 to a step 309 to display the second window 610 as a child window, as shown in FIG. 9. Wherein, when a lower-rank object of the object corresponding to the figure block 601 is already specified, the second window 610 accompanied by the figure blocks 611–614 is displayed. When the object corresponding to the figure block 601 has no lower-rank object, the routine proceeds from the step 307 to a step 308 to change the display color of the figure block 601 for the purpose of warning the user.

In this way, as shown in FIG. 9, the second window 610 is displayed so as to represent the figure block 601 of the first window 600, and the four lower-rank figure blocks 611–614 are arranged onto the second window 610.

Figure 14:
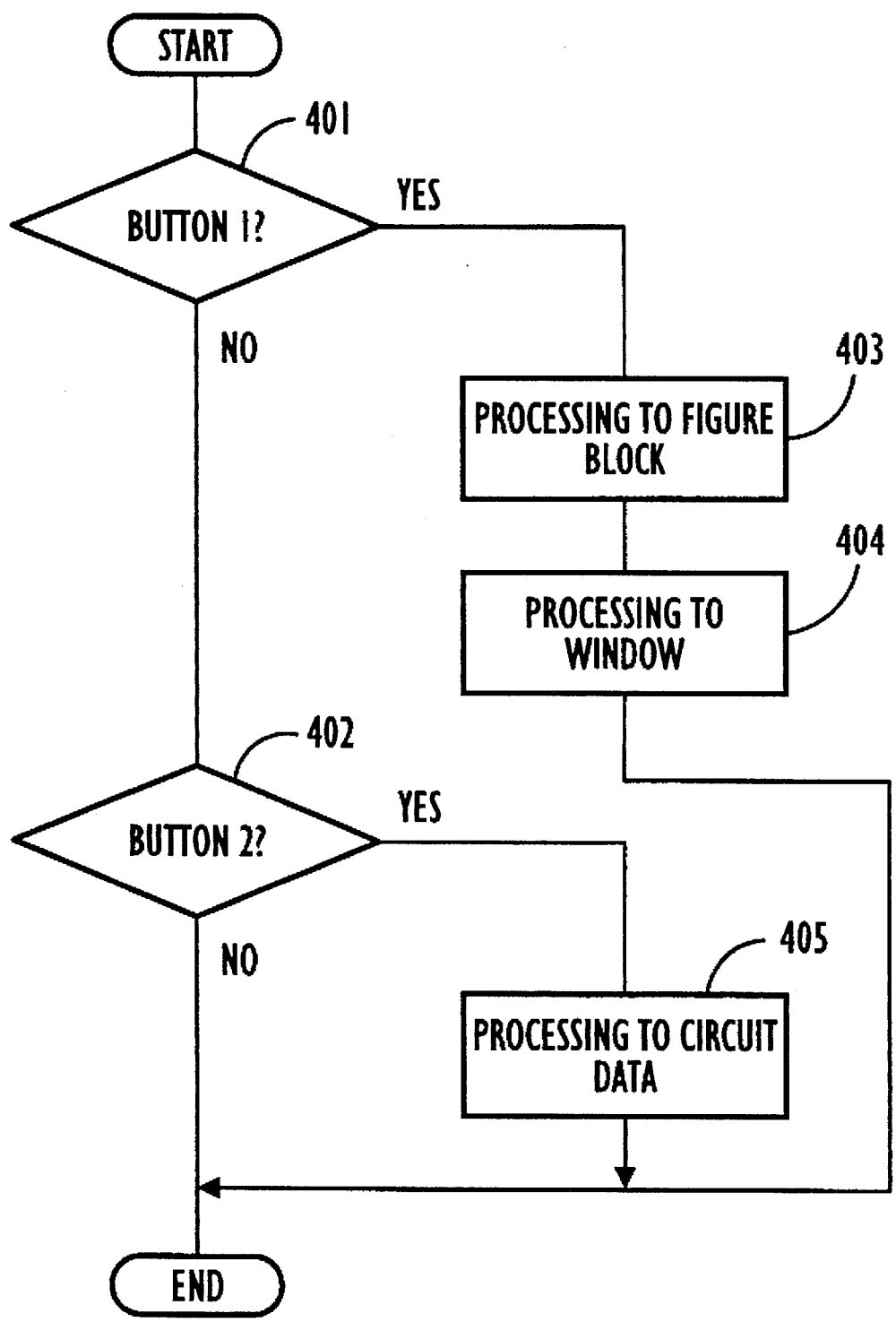
FIG. 14 is a flow chart showing a detailed procedure of a processing to the object in FIG. 13.

If any of the buttons 605, 606 on the first window 600 or any of the buttons 616, 617 on the second window 610 is selected, the routine proceeds from the step 301 to the step 302 to execute the processing to the object. FIG. 14 shows a detailed procedure in the step 302.

As shown in FIG. 14, when the first button 604 or 616 is selected, the routine proceeds from a step 401 to a step 403 and a step 404 to execute the processing to the window and the figure block representing the object. For example, transmission of the figure block may be achieved. When the second button 606 or 617 is selected, the routine proceeds form the step 402 to a step 405 to execute the processing to the circuit data which the object has. For example, logic data may be converted into layout data.

When an instruction is issued to close the second window 610 by selecting the first button 616 on the second window 610, the display state of the figure block 601 on the first window 600 is changed at the step 403 according to the display state of the second window 610, then the second window 610 is closed at the step 404. At this time, the object represented in the second window 610 sends figure information obtained by reducing the sheet 615 including the figure blocks 611–614 on the second window 610 to the object represented in the first window 600. Accompanied therewith, the shape, scale and color of the figure block 601 corresponding to the object whose design is completed are changed.

Figure 15:
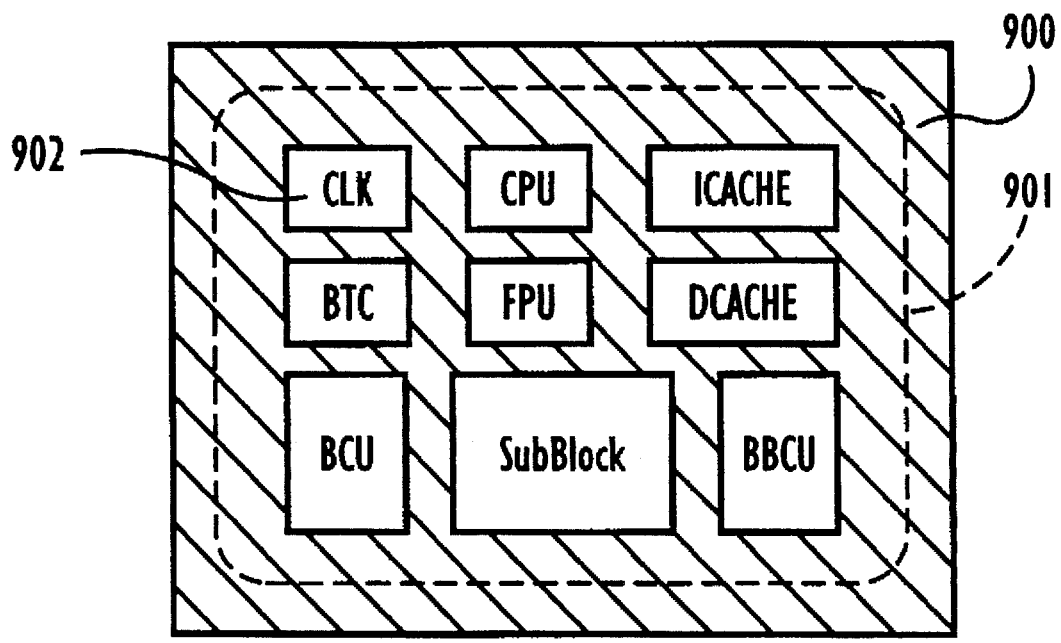
FIG. 15 is an explanatory drawing showing an example of one window having a figure block group displayed at one screen as a template in the CAD system in FIG. 1.

FIG. 15 shows an example of a batch location of nine figure blocks 902 on a sheet 900 of a certain window.

A plurality of templates 902 are registered in the memory part 503. Each template 902 is for specifying at one time object groups regarding a plurality of circuit elements. In this case, the template names are displayed as the library data selection menu 810 in FIG. 3, instead of the object names. By selecting any of the template names by operating the mouse 650, the nine objects registered in the memory part 503 are fetched all at once and the nine figure blocks 902 corresponding thereto are arranged on the sheet 900 in high speed. It is then possible to determine the circuit data to be assigned to the object corresponding to a certain figure block, e.g. a sub-block of the nine figure blocks 902.

Figure 16:
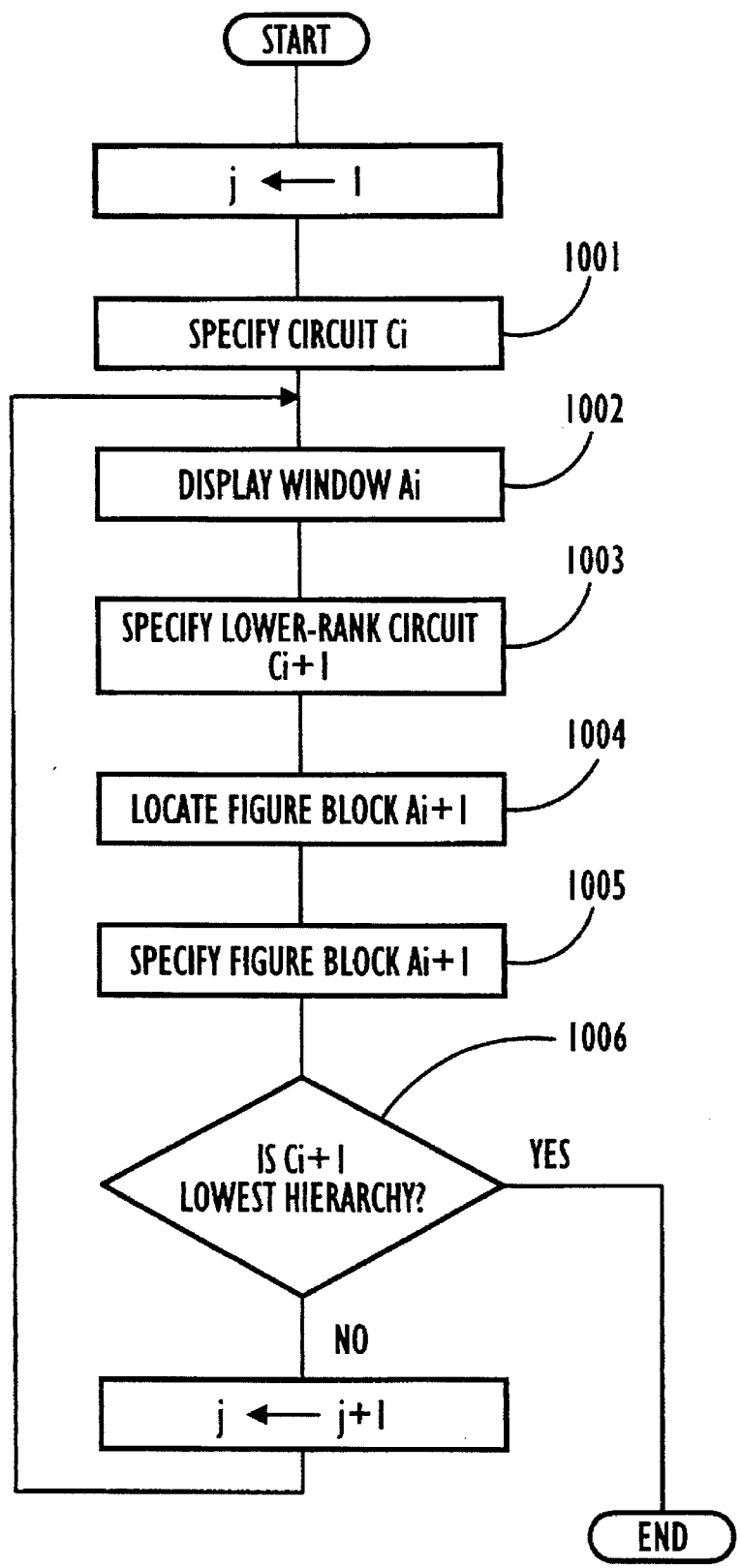
FIG. 16 is a flow chart showing a procedure of a top-down design in the CAD system in FIG. 1.
Figure 17:
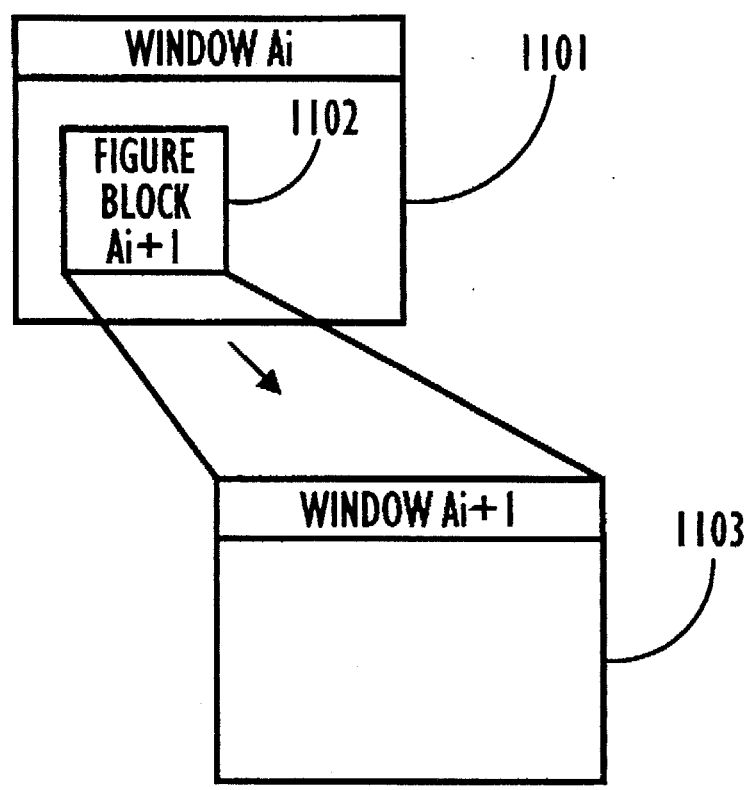
FIG. 17 is a diagram showing a menu creating method in case where the procedure of a top-down design in FIG. 16 is employed.
Figure 18:
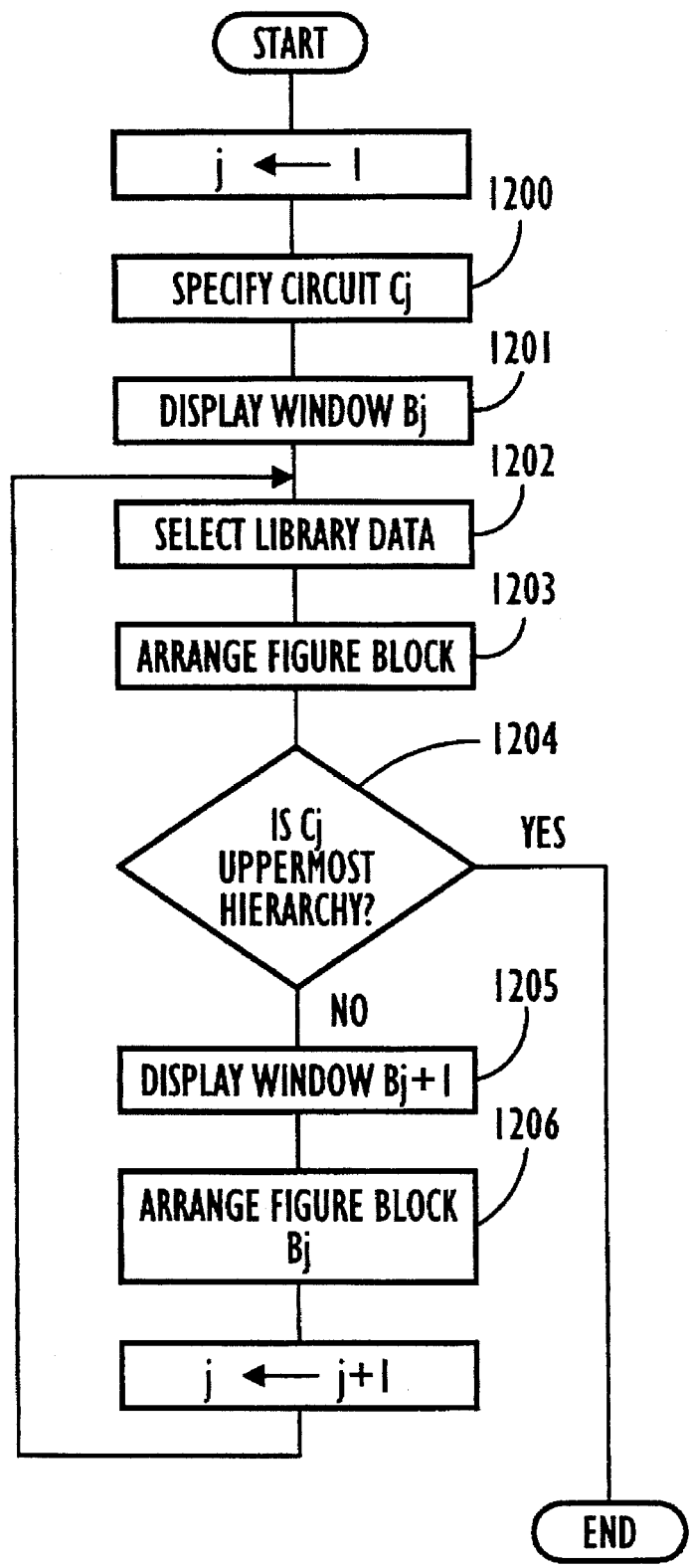
FIG. 18 is a flow chart showing a procedure of a bottom-up design in the CAD system in FIG. 1.
Figure 19:
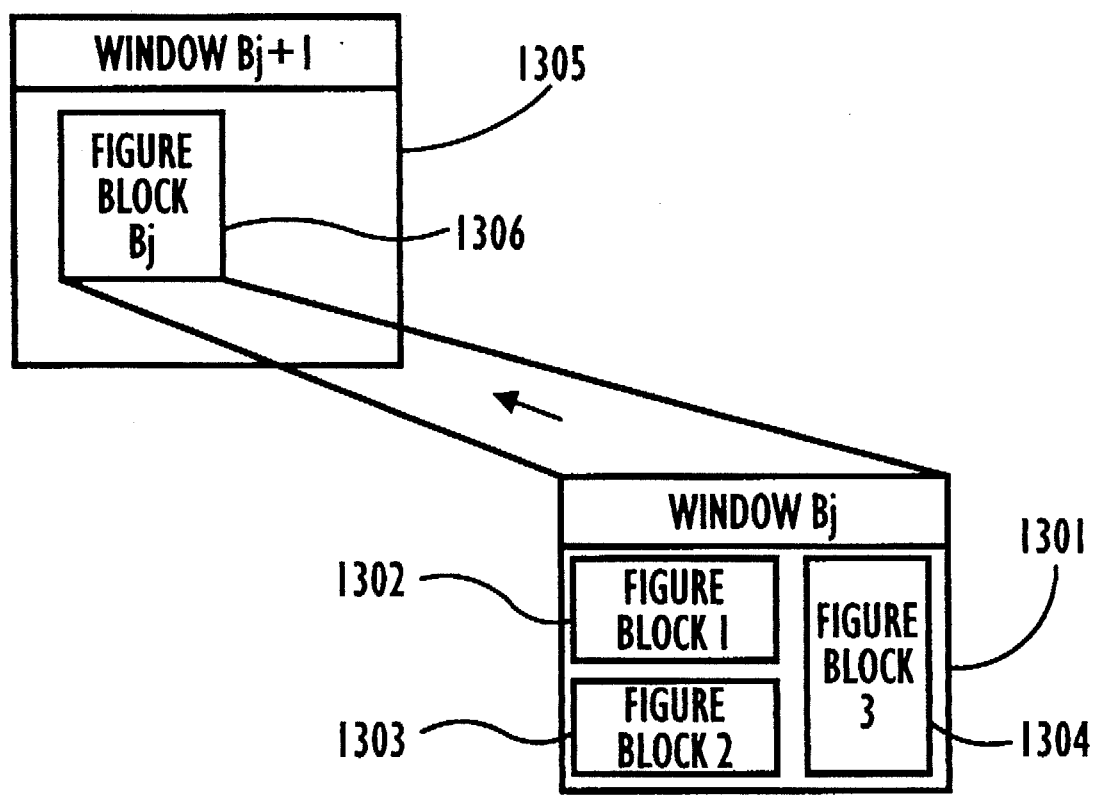
FIG. 19 is a diagram showing a menu creating method in case where the procedure of a bottom-up design inn

With the CAD system taught by the present invention, a top-down design shown in FIGS. 16 and 17 and a bottom-up design shown in FIGS. 18 and 19 are adequately conducted.

FIG. 16 is a flow chart showing a process of top-down design in the CAD system. First, a circuit Ci is specified at a step 1001. At a step 1002, a first window Ai representing the circuit Ci is displayed on the menu screen. At a step 1003, a circuit Ci+1 which is a lower-rank circuit composing the circuit Ci is specified. At step 1004, a figure block Ai+1 is specified by operating the mouse. At step 1006, whether the circuit Ci+1 corresponding to the figure block Ai+1 is the lowest hierarchy of the circuit to be designed is judged. If the circuit Ci+1 is not the lowest hierarchy, the routine returns to the step 1002 to display a second window Ai+1 which is another representation of the circuit Ci+1 that the figure block Ai+1 is representing, then to continue the hierarchy design further.

FIG. 17 shows a menu creating method in case where the procedure of the top-down design in FIG. 16 is employed, wherein when the figure block Ai+1 (1102) arranged on the first window Ai (1101) is selected by operating the mouse, the second window Ai+1 (1103) which is another representation of the circuit that the figure block Ai+1 is representing is displayed.

FIG. 18 is a flow chart showing a process of bottom-up design in the CAD system. First, a circuit Cj is specified at a step 1200. At step 1201, a first window Bj representing the circuit Cj is displayed on the menu screen. At a step 1202, an object corresponding to a component element of the circuit Cj is selected from a library. At a step 1203, a figure block representing each of the selected object is arranged onto the first window Bj. At a step 1204, whether the circuit Cj corresponding to the first window Bj is the uppermost hierarchy of the circuit to be designed is judged. If the circuit Cj is not the uppermost hierarchy, a second window Bj+1 representing a circuit Cj+1 belonging to one-rank upper hierarchy of the circuit Cj is displayed at a step 1205, and the figure block Bj which is another representation of the circuit Cj that the first window Bj is representing is arranged onto the second window Bj+1. If necessary, the routine returns to the step 1202 to select an object corresponding to another component element of an upper-rank circuit Bj+1 from the library, and to arrange the figure block representing a non-selected object onto the second window Bj+1 at a step 1203. Then the hierarchy design is further continued.

FIG. 19 shows a menu creating method in case where the procedure of the bottom-up design in FIG. 18 is employed, wherein when the three figure blocks 1302–1304 are located onto the first window Bj (1301) and a transition processing to the upper hierarchy is specified, the second window Bj+1 (1305) accompanied by the figure block Bj (1306) which is another representation of the circuit that the first window Bj (1301) is representing is displayed.

As described above, according to the present invention, an object-oriented user interface is provided which is easy to visualize. Particularly, the floor plan reflecting the actual circuit data is displayed as the menu screen and various information on inside construction, shape and scale of each element is displayed in addition to the hierarchical structure of the elements at the same time in one screen, thus the operationality of the menu is enhanced. The top-down design and the bottom-up design are easily used in combination.

The menu system according to the present invention is applicable not only to the CAD system for the above circuit design but also to a data processor for program development.

circuit Ci+1 corresponding to the figure block Ai+1 is the lowest hierarchy of the circuit to be designed is judged. If the circuit Ci+1 is not the lowest hierarchy, the routine returns to the step 1002 to display a second window Ai+1 which is another representation of the circuit Ci+1 that the figure block Ai+1 is representing, then to continue the hierarchy design further.

FIG. 17 shows a menu creating method in case where the procedure of the top-down design in FIG. 16 is employed, wherein when the figure block Ai+1 (1102) arranged on the first window Ai (1101) is selected by operating the mouse, the second window Ai+1 (1103) which is another representation of the circuit that the figure block Ai+1 is representing is displayed.

FIG. 18 is a flow chart showing a procedure of bottom-up design in the CAD system. First, a circuit Cj is specified at a step 1200. At step 1201, a first window Bj representing the circuit Cj is displayed on the menu screen. At a step 1202, an object corresponding to a component element of the circuit Cj is selected from a library. At a step 1203, a figure block representing each of the selected object is arranged onto the first window Bj. At a step 1204, whether the circuit Cj corresponding to the first window Bj is the uppermost hierarchy of the circuit to be designed is judged. If the circuit Cj is not the uppermost hierarchy, a second window Bj+1 representing a circuit Cj+1 belonging to one-rank upper hierarchy of the circuit Cj is displayed at a step 1205, and the figure block Bj which is another representation of the circuit Cj that the first window Bj is representing is arranged onto the second window Bj+1. If necessary, the routine returns to the step 1202 to select an object corresponding to another component element of an upper-rank circuit Bj+1 from the library, and to arrange the figure block representing a non-selected object onto the second window Bj+1 at a step 12003. Then, the hierarchy design is further continued.

FIG. 19 shows a menu creating method in case where the procedure of the bottom-up design in FIG. 18 is employed, wherein when the three figure block 1302–1304 are located onto the first window Bj (1301) and a transition processing to the upper hierarchy is specified, the second window Bj+1 (1305) accompanied by the figure block Bj (1306) which is another representation of the circuit that the first window Bj (1301) is representing is displayed.

As described above, according to the present invention, the object-oriented user interface is provided which is easy to image visually. Particularly, the floor plan reflecting the actual circuit data is displayed as the menu screen and various information on inside construction, shape and scale of each element is displayed in addition to the hierarchical structure of the elements at the same time in one screen, thus the operationality of the menu is enhanced. The top-down design and the bottom-up design are easily used in combination.

The menu system according to the present invention is applicable not only to the CAD system for the above circuit design but also to a data processor for program development.

We claim:

1. A computer system for designing a circuit, wherein the circuit is represented by a hierarchical structure of connected circuit blocks, the computer system comprising:

object memory means for memorizing a plurality of objects, each object having information on a single circuit block, including physical information describing the shape and scale of a layout area of the circuit block;

object specifying means for specifying objects from said plurality of objects memorized by said object memory means;

menu creation means including
object input means for inputting objects specified by said object specifying means, and
hierarchy design means for designing a hierarchical structure of a menu corresponding to information of the objects input by said object input means;

menu display means for displaying a first window to represent a first object specified by said object specifying means and for displaying a first figure block group on said first window to represent the objects specified by said object specifying means and displayed in accordance with said menu creation means to represent that each object displayed in the first figure block group belongs to a lower hierarchy of the object represented by said first window, and wherein said hierarchy design means determines floor plan data of the circuit to be designed based on the respective shapes and scales of said objects displayed on said first window by said first figure block group;

object selection means for selecting an object to be processed from the objects in said first figure block group on said first window;

processing specifying means for specifying a design processing step to be applied to an object selected by said object selection means to be processed; and processing execution means for executing the design processing step specified by said processing specifying means on the object selected by said object selection means.

2. The computer system according to claim 1, wherein said object input means inputs a set of objects from said object memory means representing at least a part of said first figure block group.

3. The computer system according to claim 1, wherein said menu display means, cooperating with said menu creation means, displays a second window to represent an object represented in said first figure block group and displays a second figure block group on said second window to represent at least one object belonging to a lower hierarchy of said object represented by said second window.

4. The computer system according to claim 3, wherein each object further has physical information of a shape and scale of a layout area of the circuit block it describes, and said hierarchy design means determines a shape and scale of said object corresponding to said second window, as displayed in said first figure block group on said first window, according to respective shapes and scales of objects in said second figure block group.

5. The computer system according to claim 1, wherein said menu display means, cooperating with said menu creation means, displays a second window to represent an object belonging to an upper hierarchy of the object represented by said first window, and displays said object represented by said first window as a figure block on the second window.

6. The computer system according to claim 5, wherein each object further has physical information of a shape and scale of a layout area of the circuit block it describes, and said hierarchy design means determines a shape and scale of said object corresponding to said first window as displayed as said figure block on said second window, according to respective shapes and scales of objects in said first figure block group.

7. A method of creating graphical menus for selecting an object from a plurality of objects arranged in a hierarchical structure, to be processed on a screen of a computer system, comprising the steps of:

displaying a first window on the screen to represent one of the plurality of objects;

displaying a first figure block group on the first window to represent at least one object belonging to a lower hierarchy of the object represented by the first window;

deriving physical information determinative of the shapes and scales of the first window and the first figure block group from the respectively corresponding objects, wherein the steps of displaying the first window and the first figure block reflect the derived physical information;

displaying a second window on the screen to represent an object represented in the first figure block group; and displaying a second figure block group on the second window to represent at least one object belonging to a lower hierarchy of the object represented by the second window.

8. The menu creating method according to claim 7, further comprising the step of determining a shape and scale of the second window according to the respective shape and scale of the object represented by the second window, as displayed in the first figure block group on the first window.

9. The menu creating method according to claim 7, further comprising the step of inputting a group of objects to represent at least a part of the first figure block group.

10. The menu creating method according to claim 7, wherein the computer system is a computer aided design (CAD) system.

11. A method of creating graphical menus for selecting an object from a plurality of objects arranged in a hierarchical structure, to be processed on a screen of a computer system, comprising the steps of:

displaying a first window on the screen to represent one of the plurality of objects;

displaying a first figure block group on the first window to represent at least one object belonging to a lower hierarchy of the object represented by the first window;

deriving physical information determinative of the shapes and scales of the first window and the first figure block group from the respectively corresponding objects, wherein the steps of displaying the first window and the first figure block reflect the derived physical information;

displaying a second window on the screen to represent an object belonging to an upper hierarchy of the object represented by the first window; and displaying a second figure block group on the second window to represent at least one object belonging to a lower hierarchy of the object represented by the second window, wherein the at least one object includes the object represented by the first window.

12. The menu creating method according to claim 11, further comprising the step of determining a shape and scale of the object represented by the first window, as displayed in the second figure block on the second window, according to the respective shape and scale of the first window.

13. The menu creating method according to claim 11, further comprising the step of inputting a group of objects to represent at least a part of the first figure block group.

14. The menu creating method according to claim 11, wherein the computer system is a computer aided design (CAD) system.

* * * * *